(12) United States Patent
Negru et al.

(10) Patent No.: US 9,307,590 B2
(45) Date of Patent: Apr. 5, 2016

(54) NON-LINEAR CURRENT IDAC WITH SYNTHESIS IN TIME DOMAIN

(71) Applicants: Sorin Laurentiu Negru, San Jose, CA (US); Sule Cetin, Istanbul (TR); Parinda Mekara, Mountain View, CA (US)

(72) Inventors: Sorin Laurentiu Negru, San Jose, CA (US); Sule Cetin, Istanbul (TR); Parinda Mekara, Mountain View, CA (US)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 14/471,099

(22) Filed: Aug. 28, 2014

(65) Prior Publication Data

US 2016/0066371 A1    Mar. 3, 2016

(51) Int. Cl.
*H05B 37/02* (2006.01)
*H05B 33/08* (2006.01)
*H03M 1/66* (2006.01)

(52) U.S. Cl.
CPC .............. *H05B 33/0809* (2013.01); *H03M 1/66* (2013.01)

(58) Field of Classification Search
CPC ........... H05B 37/02; G09G 3/32; G09G 3/36; G09G 3/3233; G09G 3/3291
USPC ............. 315/209 R, 224–226, 291–297, 307, 315/308, 312; 345/76–82, 102, 204, 211
See application file for complete search history.

(56) References Cited

U.S. PATENT DOCUMENTS

| 7,482,629 | B2 * | 1/2009 | Hayakawa | ........... G09G 3/3233 257/59 |
| 2008/0111503 | A1 * | 5/2008 | Ess | ..................... H05B 33/0818 315/297 |

* cited by examiner

*Primary Examiner* — Jimmy Vu
(74) *Attorney, Agent, or Firm* — Donald E. Schreiber

(57) ABSTRACT

An electrical current ("I") digital-to-analog converter ("IDAC") (60) supplies a specified electrical current to at least one light emitting diode. The IDAC (60) includes a plurality of current sources/sinks (26): a. that are connected in parallel so a total amount of current flowing through the at least one LED equals the sum of their individual electrical currents; and b. at any instant in time individual current sources/sinks (26) are either: 1. turned on: or 2. turned off. When the specified electrical current being supplied exceeds a pre-established threshold (94), a sequence of individual current sources/sinks (26) are turned on ever more quickly to produce a. non-linearly increasing electrical current. When the specified electrical current being supplied is below the pre-established current threshold (94), the non-linearly increasing electrical current is supplied by an increasing number of additional current sources/sinks (26), each additional current source/sink (26) producing progressively longer current pulses until that current source/sink {26} remains fully on.

12 Claims, 7 Drawing Sheets

NON-LINEAR CURRENT IDAC WITH SYNTHESIS IN TIME DOMAIN

BACKGROUND

1. Technical Field

The present disclosure relates generally to electrical current ("I") digital-to-analog converters ("IDACs") particularly for supplying electrical current to light emitting diodes ("LEDs"), most specifically white light emitting diodes ("WLEDs").

2. Background Art

An IDAC is an important component included in many different types of data converter systems. An IDAC converts binary digital data into an analog electrical current. That is, a particular digital code (number) received by the IDAC specifies that the IDAC is to provide a particular analog current to some other component in a system. Usually, each binary digit ("bit") in the digital code can be understood as acting on a switch included in the IDAC. Each switch in the IDAC connects between an output of the IDAC and a current source or sink included in the IDAC. Depending upon the value of each bit in the digital code, i.e. 0 or 1, each switch included in the IDAC provides either no current or a specified amount of current to the other system component via the IDAC's output. In this way, operation of all the switches are:

1. controlled respectively by bits in the digital code; and
2. are connected in parallel supply a total output current from the IDAC to the other system component.

In conventional integrated circuits ("ICs"), the amount of current supplied by individual IDAC's switches is determined by the IC's physical layout, i.e. the size of individual components included in the IDAC IC. Most frequently, a computer program generates the digital code received by the IDAC that specifies which switches are to be turned on or off. If each of the IDAC's switches supplies the same amount of electrical current to the IDAC's output, it is frequently called a unary IDAC.

FIG. 1 schematically depicts such a unary IDAC referred to by the general reference character 20. The unary IDAC 20 includes N individual switches 22, SW1 to SWN, each of which connects between an output 24 of the unary IDAC 20 and a current source/sink 26 included in the IDAC. In the schematic illustration of FIG. 1, a second terminal of each of the current sources/sinks 26 connects to circuit ground 28. While FIG. 1 illustrates an unary IDAC that employs several current sinks connected in parallel to circuit ground 28 with a load being implicitly connected between the output 24 and a source of electrical power, as will be apparent to those skilled in the art of analog circuit design a functionally equivalent IDAC may be assembled in which:

1. current sources, as contrasted with current sinks, connect in parallel to the source of electrical power: and
2. the load connects between:
   a. common terminals of all the switches connected respectively in series with the current sources; and
   b. circuit ground 28.

The unary IDAC 20 receives a digital code K which specifies which of the switches 22 are to either be turned on or turned off. Each switch 22 when turned on supplies or sinks the same amount of electrical current I to or from the output 24. Closing switches 22 causes the unary IDAC 20 depicted in FIG. 1 to draw an electrical current equal to K*I. Because the output current is a linear function of K, the unary IDAC 20 depicted in FIG. 1 is frequently called a linear IDAC.

One specific use for IDACs is controlling electrical current flowing through LEDs used for backlight illumination of displays, e.g. liquid crystal displays ("LCD"). Presently, virtually all consumer devices particular portable devices such as cell phones, tablets, laptops, etc. include a LCD that a user employs in interacting with the device. Presently, display engineers expend more and more effort to make the image appearing on a LCD comfortable to human visual perception in ambient lighting environments that are constantly changing, e.g. moving from inside a building into bright sunlight. Furthermore, devices containing a backlit LCD display may include an ambient light sensor so the device may automatically adapt to changes in ambient lighting without requiring user interaction.

Changes in display brightness that differ from those to which humans are accustomed is at least uncomfortable and may be even stressful to a human viewing an LCD display. Making a backlighting change comfortable to the human eye requires a non-linear current change that increases more rapidly as backlighting becomes brighter. Specifically, accommodating backlighting to human visual perception requires that LCD display brightness conform to the following two (2) basic rules.

1. Changing display brightness should be non-linear in accordance with an exponential, cubic or square law during a time interval.
2. At every instant in time, the relative change in display brightness during the prior instant in time should not exceed one-half of one percent (0.5%).

Implementing a backlight illumination function that conforms with two (2) preceding rules is difficult. Implementing such a backlight illumination function requires both digital and analog circuit design skills. Stated more precisely, there presently exists a technological problem in digitally generating a LCD brightness electrical current that changes in accordance with an exponential/cubic/square profile which, at any instant in time, does not change more than one-half of one percent (0.5%).

FIG. 2 illustrates one technique for generating a staircase non-linear electrical current 32 approximation to an exponential current using an IDAC. The specific technique illustrated in FIG. 2 uses a constant time interval $T_0$ between each change in electrical current, usually a clock signal, and binary weighted current changes ($I_1 < I_2 < I_3 < I_4 < I_5 <$ etc.). While in theory one might configure this type of IDAC to exhibit performance in accordance with the two (2) preceding basic rules, present semiconductor fabrication technology cannot provide an accurate non-linear current over a range that extends from very small currents, e.g. nano-amperes (nA), to much larger currents, e.g. one-hundred micro-amperes (100 μA).

BRIEF SUMMARY

An object of the present disclosure is to provide an IDAC IC and method for operating an IDAC that changes LCD brightness in accordance with an exponential/cubic/square profile.

Another object of the present disclosure is to provide an IDAC IC and method for operating an IDAC wherein successive LCD brightness changes do not exceed one-half of one percent (0.5%).

Another object of the present disclosure is to provide display backlighting that is more comfortable to the human eye.

Briefly disclosed herein are an electrical current digital-to-analog converter integrated circuit ("IC") and a method for operating an IDAC when supplying a specified electrical current to at least one light emitting diode included in a display. The disclosed IDAC IC includes:

a. a digital control; and
b. an analog circuit.

The digital control:
a. receives IDAC control digital signals that specify how the IDAC IC is to operate when supplying the specified electrical current to at least one LED; and
b. generates digital signals for effecting such operation by the IDAC IC.

The analog circuit includes a plurality of individual current sources/sinks:
a. connectable in parallel to the LED so that a total amount of electrical current flowing through the LED equals the sum of individual electrical currents respectively flowing through each of the current sources/sinks; and
b. at any instant in time connected current sources/sinks are either:
1. turned on for supplying electrical current to the LED: or
2. turned off thereby supplying no electrical current to the LED.

The analog circuit responsive, to digital signals received from the digital control, operates in a first mode so that when the specified electrical current exceeds a pre-established current threshold, increasing the electrical current flowing through the LED is effected by successively turning on individual current sources/sinks included in the IDAC IC that had been previously turned off. The analog circuit, again responsive to digital signals received from the digital control, also operates in a second mode so that when the specified electrical current is less that the pre-established current threshold, increasing the electrical current flowing through the LED is effected by turning on at least one additional current source/sink included in the IDAC IC that had been previously turned off. In turning on this additional current source/sink when operating in the second mode, the additional current source/sink is initially turned alternatively on and then off so as to thereby generate a sequence of progressively longer electrical current pulses until the additional current source/sink remains fully on.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIG. 7 is a graph depicting an electrical current increase that occurs as a sequence of progressively longer electrical current pulses generated by a current source/sink until the current source/sink remains fully on.

DETAILED DESCRIPTION

Figure 2:
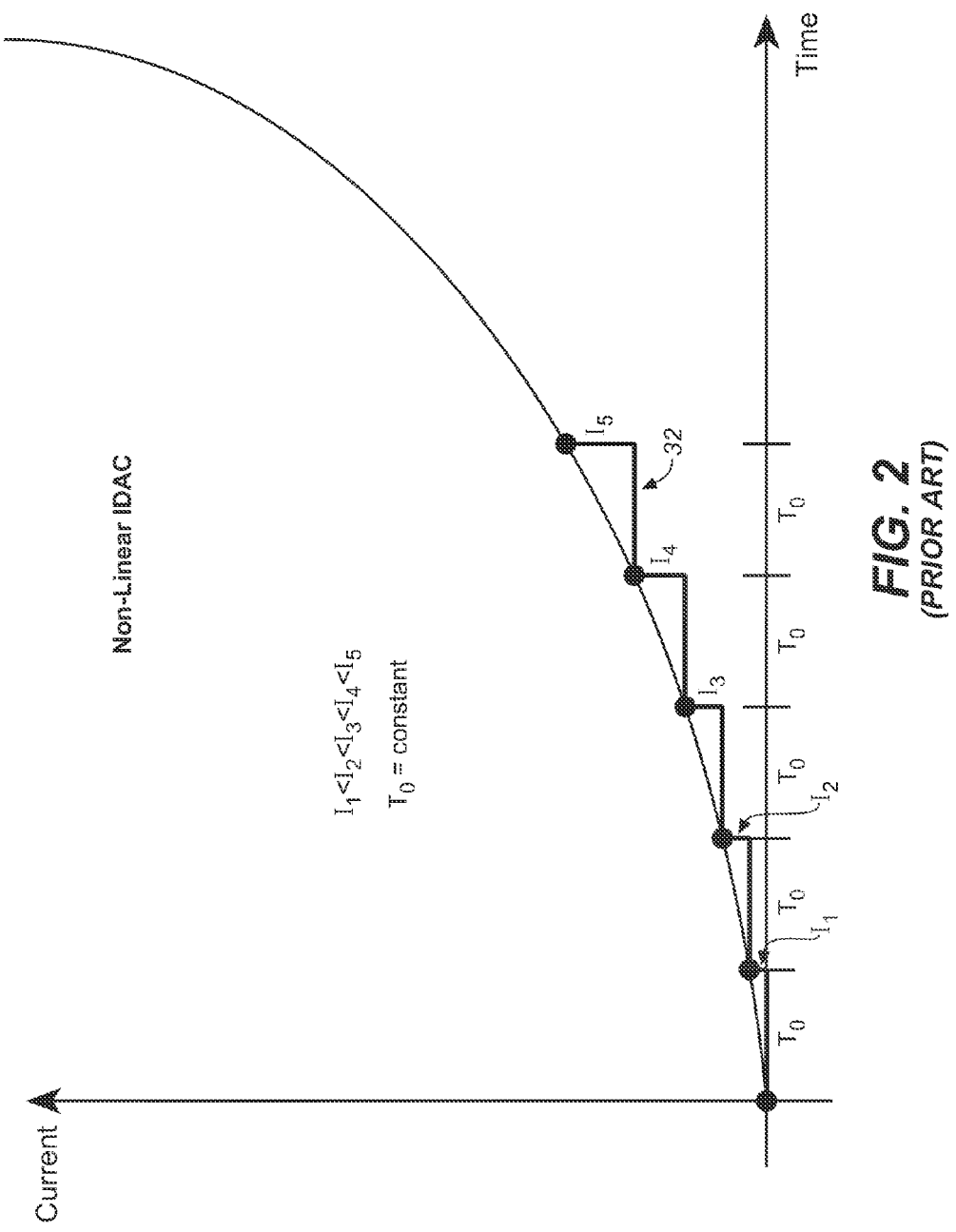
FIG. 2 is graph depicting a non-linear staircase electrical current produced by an IDAC that employs progressively larger changes in electrical current, each of which changes occurs at the end of successive, equal-length time intervals.
Figure 3:
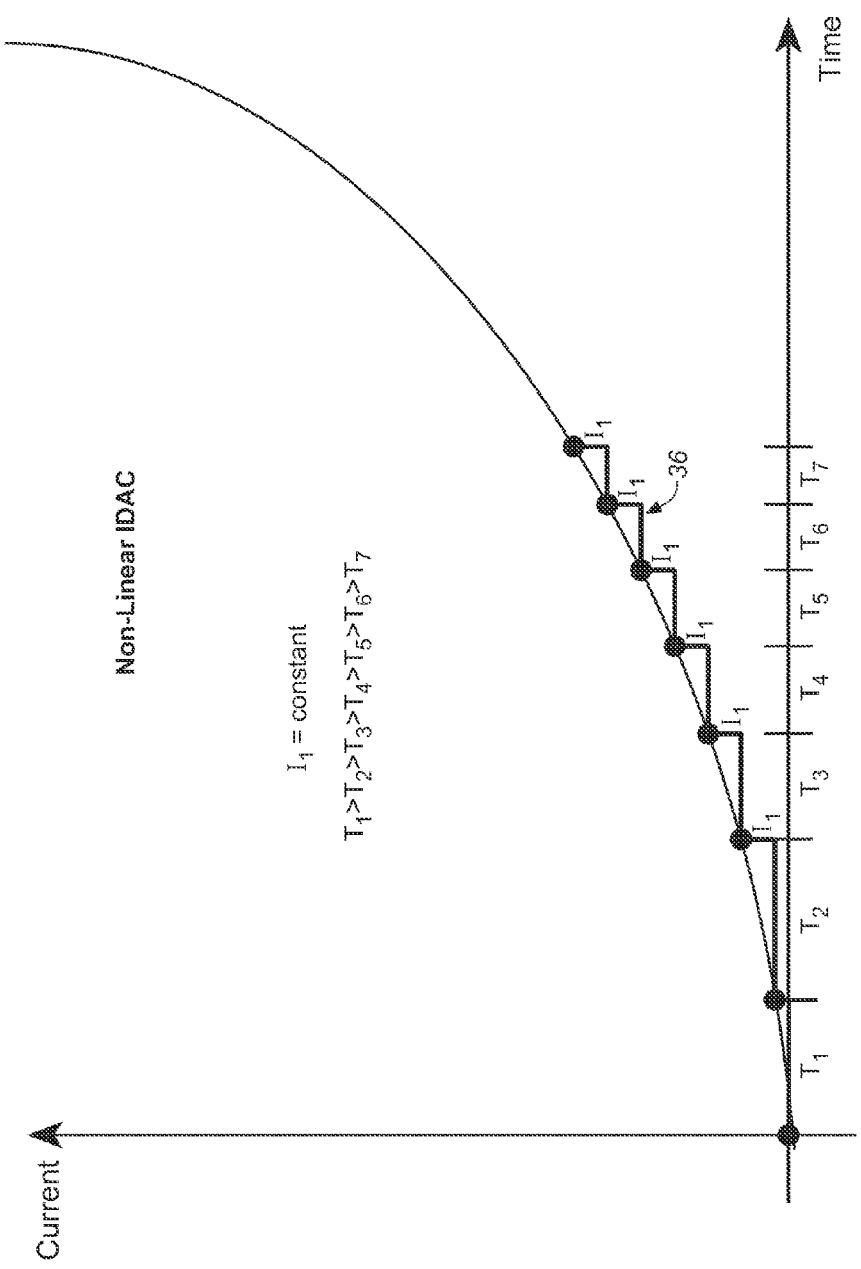
FIG. 3 is graph depicting an alternative non-linear staircase electrical current produced by an IDAC that employs identical changes in electrical current, each of which changes occurs at the end of successive, progressively shorter time intervals.

FIG. 3 illustrates an alternative technique for generating a non-linear staircase electrical current 36 approximation to a non-linear exponentially increasing electrical current using an IDAC having characteristics that differ fundamentally from the technique depicted in FIG. 2. FIG. 3 uses the same electrical current change $I_1$ at the and of each time interval and a sequence of progressively shorter time intervals, preferably exponentially shorter time intervals, $(T_1 > T_2 > T_3 > T_4 > T_5 > T_6 > T_7)$ between successive changes in electrical current.

Implementing a plurality of constant current sources for inclusion in an IDAC that is capable of producing the time varying current profile depicted in FIG. 3 and described above is a well known to those skilled in the art of analog integrated circuit design.

If a sequence of time intervals $(T_{n+1} > T_n = 1 \ldots \text{max})$ depicted in FIG. 3 were to range from 0.1 ms to 100 ms, then a 2 MHz clock generator provides a minimum time step (LSB in the time domain) of 0.5 µs. Using digital synthesis, generating a sequence of time intervals extending from 0.5 is to 100 ms, i.e. produces a 200,000:1 range of time intervals.

Figure 4:
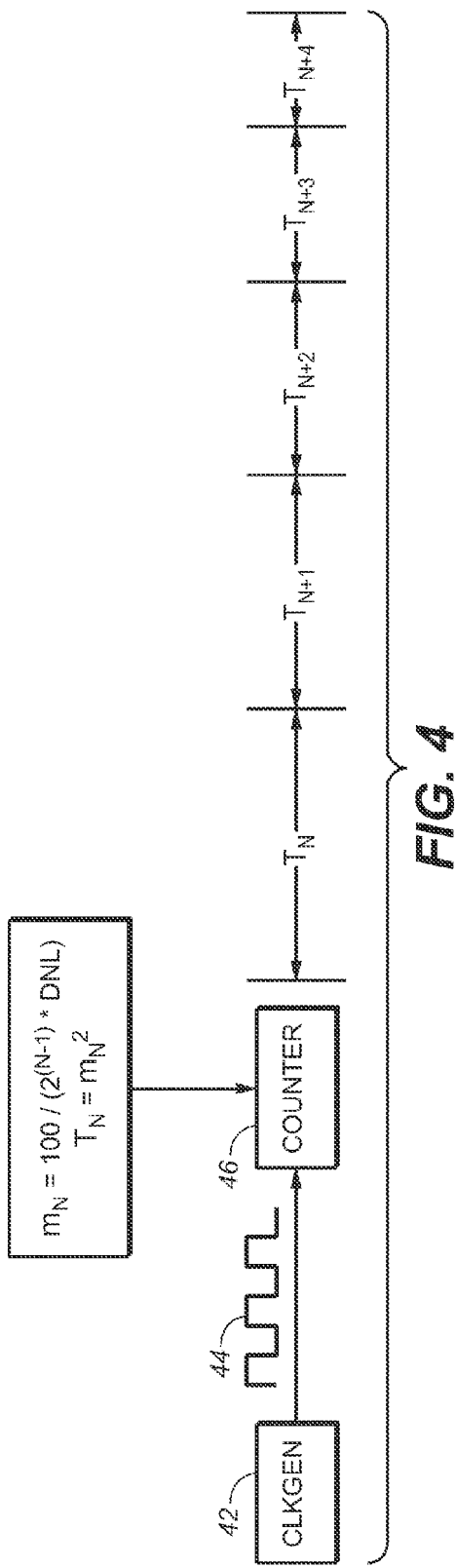
FIG. 4 is a functional block diagram depicting a digital circuit for synthesizing a sequence of exponentially shorter time intervals.

FIG. 4 depicts a digital circuit that implements an algorithm for synthesizing a sequence of non-linear exponentially shorter time intervals having the preceding characteristics. The digital circuit depicted in FIG. 4 includes a clock generator 42 that produces a 2 MHz clock signal 44 and a digital counter 46 that receives the clock signal 44. Signal(s) feedback internally within the digital counter 46 causes the counter to generate sequence of pulses occurring at ever shorter time intervals $(T_n > T_{n+1} > T_{n+2} > T_{n+3} > T_{n+4} \ldots )$.

Implementing a non-linear IDAC that uses unary IDAC current sources/sinks of the type described above in connection with FIG. 1 whose output current is controlled by an appropriate proper sequence of time intervals having characteristics of the type depicted in FIG. 3 and described in the preceding paragraph permits generating any desired output electrical current profile. Such a non-linear IDAC requires only simple conventional analogue constant current sources, but makes digitally generating the time interval sequence more complex. However, such a non-linear IDAC is clearly feasible due to the enormous resolution existing in time domain.

Conversely, as described previously an IC IDAC that uses the technique depicted in FIG. 2 requires an ensemble of different analog current sources which are activated by a sequence of identical time intervals to provide an equivalent range of output electrical current, i.e. a current range of 200,000:1. Present and reasonable foreseeable IC fabrication techniques do not permit building such an ensemble of current sources in a single IC.

Figure 5:
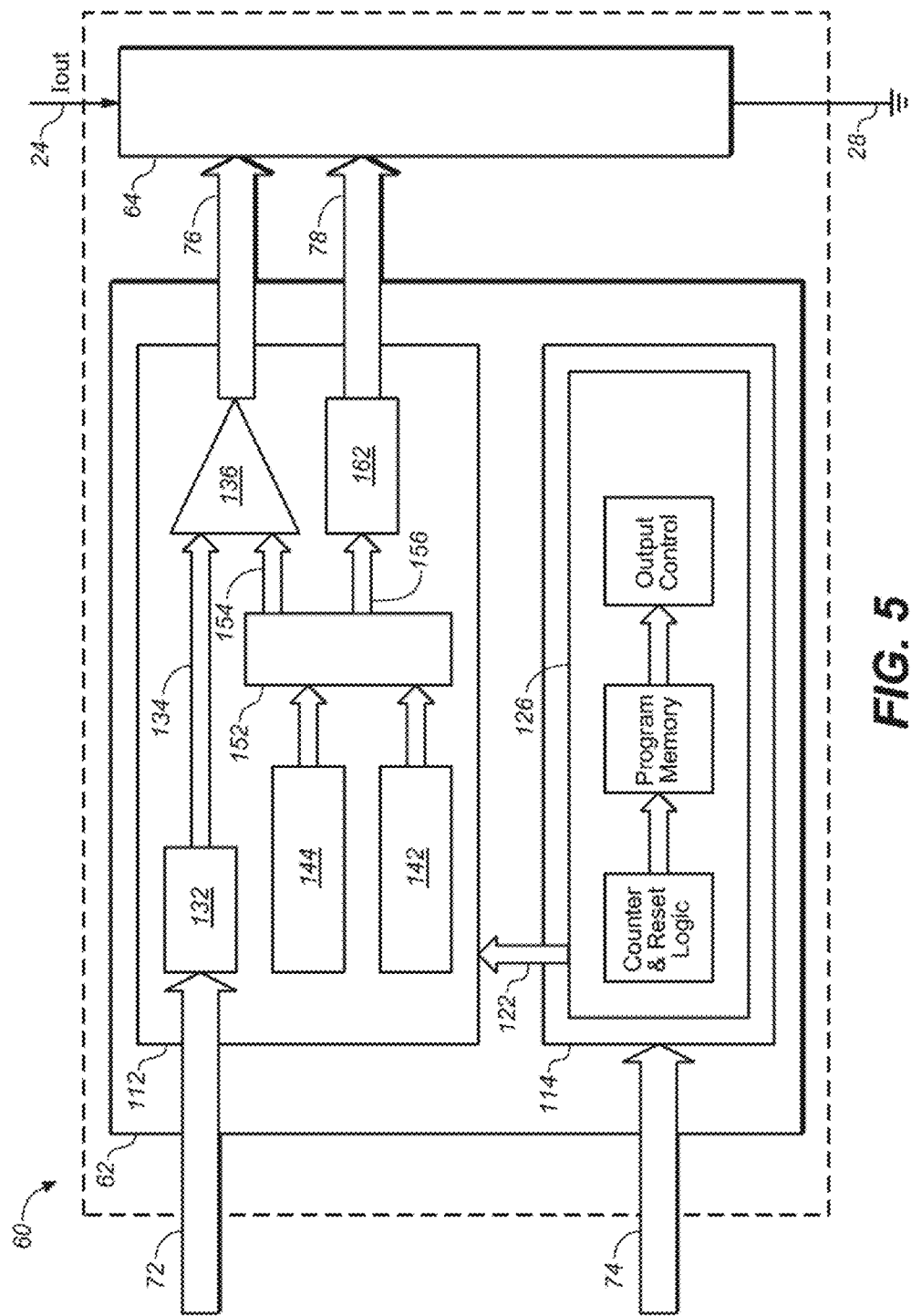
FIG. 5 is a functional block diagram depicting an IDAC IC for converting binary digital data into an analog electrical current in accordance with the present disclosure that includes a digital control for controlling the operation of an analog circuit.

The block diagram of FIG. 5 depicts a presently preferred embodiment for an IC IDAC in accordance with the present disclosure that is enclosed within a dashed line in FIG. 5, and that is referred to by the general reference character 60. As described in greater detail below, the IDAC 60 receives binary digital data and, in accordance with the present disclosure, converts that data into an analog electrical current for energizing a display's backlight LED(s). As depicted in FIG. 5, the IDAC 60 includes a digital control 62 for controlling the amount of electrical current flowing through an analog circuit 64 also included in the IDAC 60 that connects in series with the backlight LED(s).

Figure 1:
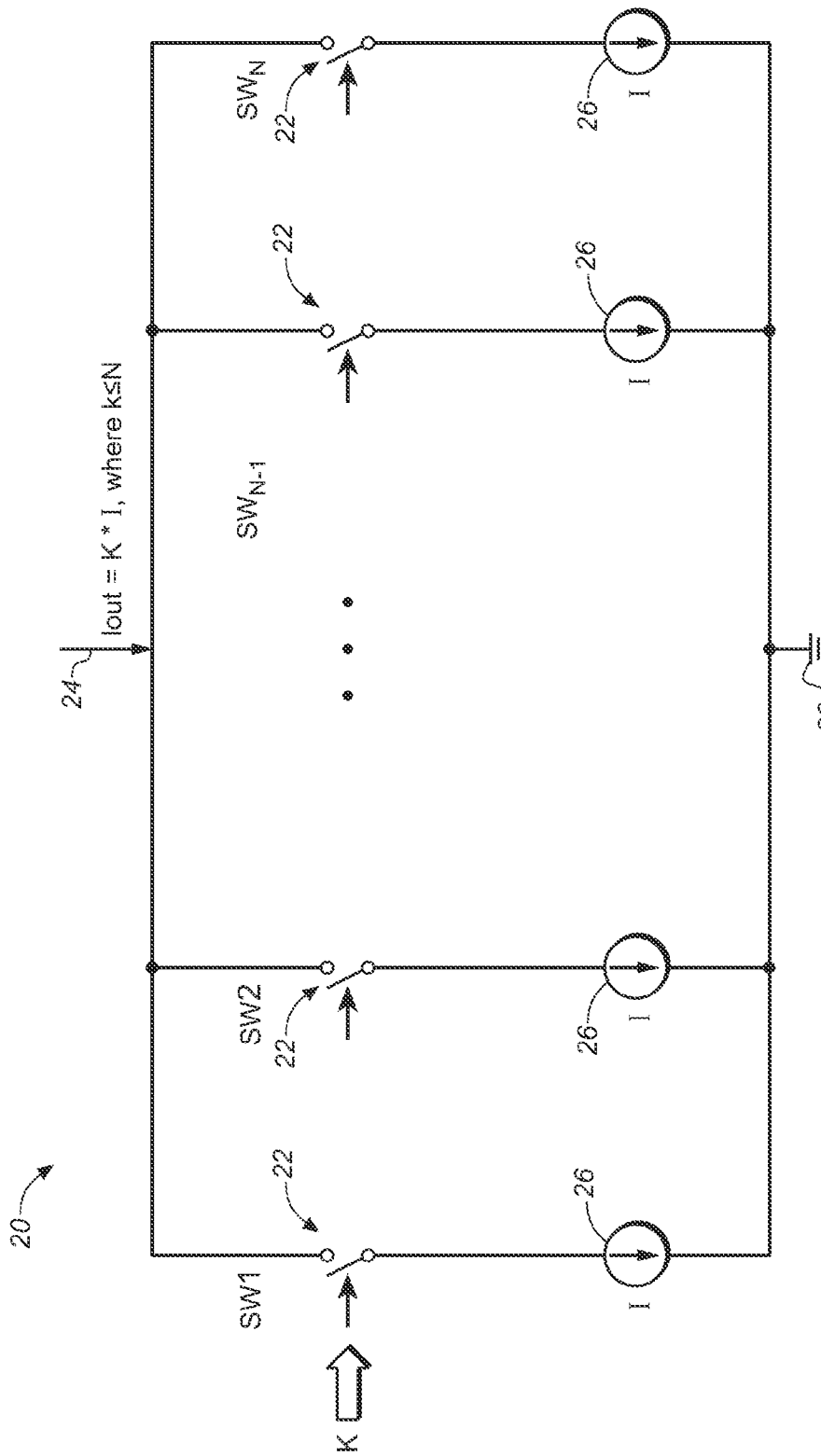
FIG. 1 is a block diagram conceptually illustrating a generalized unary, linear IDAC.

Similar to the unary IDAC 20 depicted in FIG. 1, the analog circuit 64 includes a number of series connected pairs of switches and current sinks, not separately illustrated in FIG. 5, all of which connect in parallel between an output 24 of the IDAC 60 and circuit ground 28. As explained previously in connection with FIG. 1, those skilled in the art of analog circuit design know that a functionally equivalent IDAC 60 may be assembled in which series connected switches and current sources connect to a source of electrical power rather than series connected switches and current sinks connecting to circuit ground 28. Preferably the analog circuit 64 includes 2,048 pairs of series connected switches and current sinks each of which pairs, when turned on, preferably conducts twelve microamperes (12 µA) of electrical current between the output 24 of the IDAC 60 and circuit ground 28. Depending upon various different configurations of the switches included in the analog circuit 64, this a configuration for the analog circuit 64 permits the IDAC 60 to conduct certainly no fewer than 2,048 different amounts of electrical current between the output 24 and circuit ground 28, i.e. no fewer than 2,048 different electrical currents above zero millamperes (0.0 mA) up to twenty-four and five-hundred and seventy-six thousandths milliamperes (24.576 mA).

As explained in greater detail below, in controlling electrical current flowing through the analog circuit 64 the presently preferred digital control 62 responds both to:
1. IDAC current digital data 72 specifying an amount of current that will flow through the analog circuit 64; and
2. IDAC change rate digital data 74 specifying a rate at which current is to change between successive current values specified by the IDAC current digital data 72.

Both types of digital data 72 and 74 are usually transmitted to the IDAC 60 from a microprocessor included in a portable device such as a cell phone or tablet that is not depicted in any of the FIGS. As described in greater detail below, the digital control 62 provides the IDAC 60 with a configurable electrical current setting environment thereby providing software flexibility in selecting different operating modes for the IDAC 60.

Responsive to the digital data 72 and 74, the digital control 62 sends two (2) different types of digital control signals to the analog circuit 64 respectively via;
1. an eleven bit wide IDAC current digital data bus 76; and
2. a PWM control digital data bus 78.

Considering the second of the two (2) rules presented previously, if approximately 200 of the series connected switches and current sinks included in the analog circuit 64 are turned on concurrently, the electrical current flowing through the IDAC 60 will be 2.4 mA. One-half of one percent (0.5%) of two and four-tenths (2.4) mA equals twelve (12) µA, i.e. the amount of electrical current supplied by a single switch and current sink pair included in the analog circuit 64. Consequently if 200 or more switches included in the analog circuit 64 are turned on concurrently, turning on one more switch in the analog circuit 64 increases the electrical current flowing through the IDAC 60 by only twelve (12) µA. That is, the electrical current increase effected by turning on a single series connected switch and current sink pair does not exceed 0.5% of the electrical current previously flowing through the IDAC 60, i.e. does not violate the second of the two (2) rules.

Consequently for the presently preferred embodiment of the IDAC 60, if the number of switches included in the analog circuit 64 that are turned on equals or exceeds 200, to increase current flowing through the IDAC 60 additional switches are turned on one after another to increase current flowing through backlighting LED(s):
1. based solely upon the strategy depicted in FIG. 3:
2. in response to a timing signal having a sequence of intervals that decrease exponentially such as may be generated by the circuit illustrated in FIG. 4.

A portion of a curve 92 in FIG. 6 between a pair of parallel dashed horizontal lines illustrates a non-linear exponentially increasing electrical current that flows through the IDAC 60 when operating;
1. at or above a current threshold line 94 that indicates an electrical current of two and two-hundred and one thousandths (2.201) mA; and
2. at or below a maximum current line 96 that indicates a maximum electrical current flowing through the IDAC 60 of twenty-four and five-hundred and seventy-six thousandths (24.576) mA.

However, if electrical current flowing through the IDAC 60 is less than two and two-hundred and one thousandths (2.201) mA then simply turning on another switch increases electrical current flowing trough the IDAC 60 by more that 0.5% of the current previously flowing through the IDAC 60, i.e. would violate the second of the two (2) rules. Furthermore if no current is flowing through the IDAC 60, i.e. when all 2,048 series connected switch and current sink pairs included in the analog circuit 64 are turned off, even a minute increase in electrical current surely violates the second of the two (2) rules, i.e. any electrical current increase exceeds 0.5% of no current flowing through the IDAC 60. Consequently, when electrical current flowing through the analog circuit 64 to a backlight's LED(s) is below two and two-hundred and one thousandths (2.201) mA the IDAC 60 preferably employs a different strategy for increasing electrical current than that described previously when the electrical current exceeds two and two-hundred and one thousandths (2.201) mA.

Figure 6:
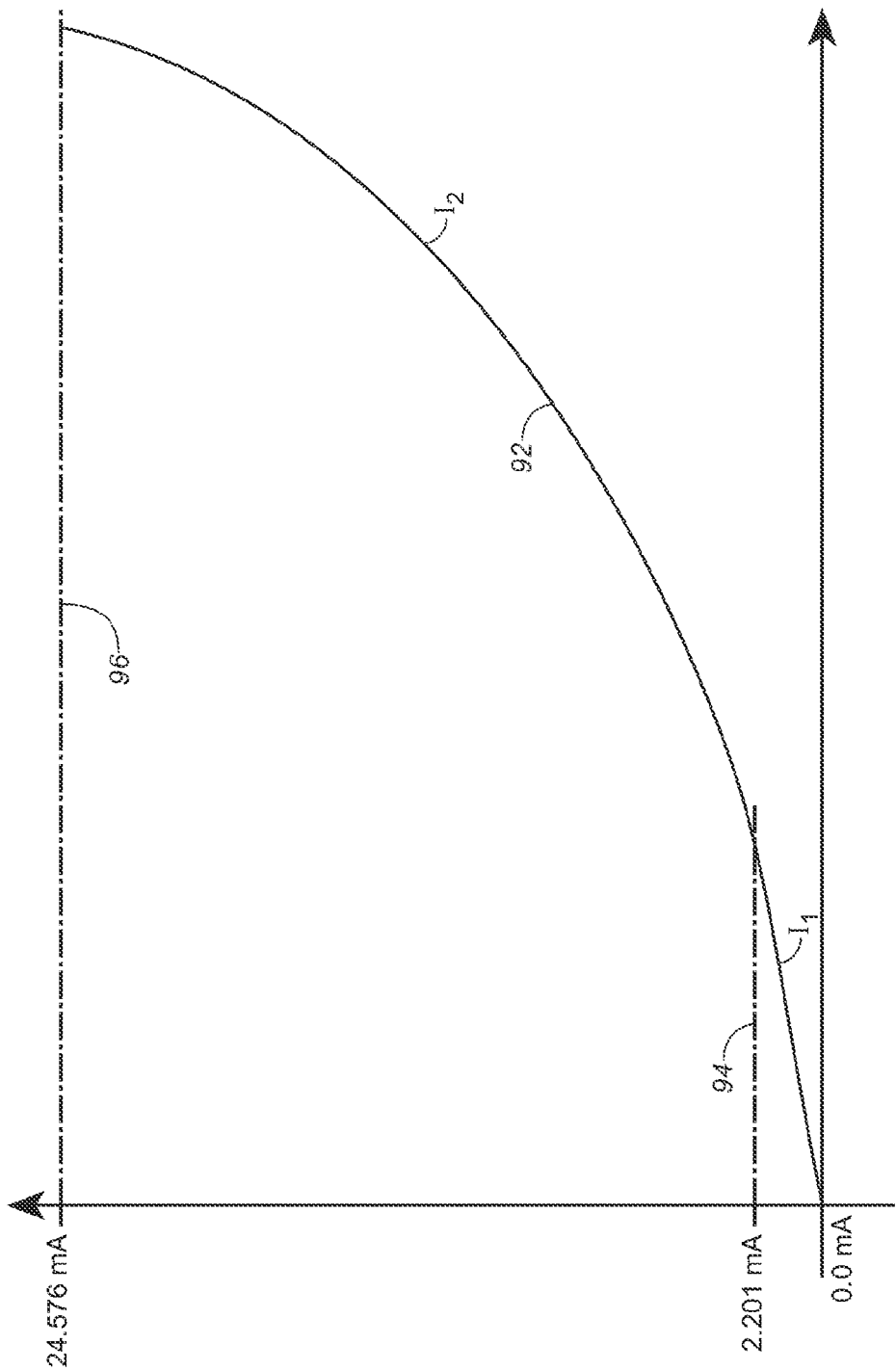
FIG. 6 is graph depicting non-linear electrical current that, depending upon operating conditions, flows through the IDAC IC depicted in FIG. 5.
Figure 7:
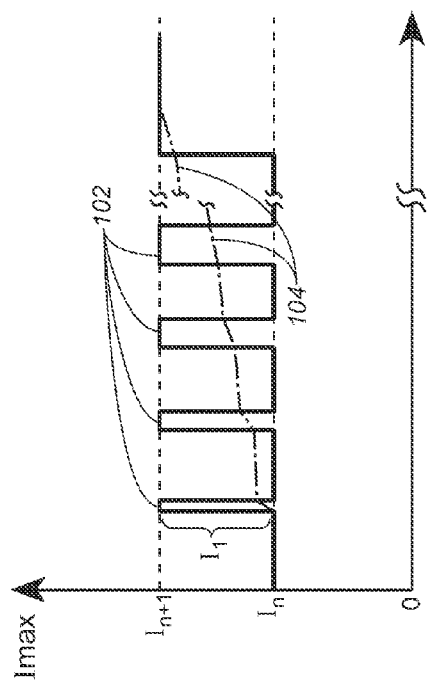

In preserving the spirit if not the letter of the second of the two (2) rules, when electrical current flowing through the IDAC 60 is less than two and two-hundred and one thousandths (2.201) mA:
1. as depicted by the curve 92 in FIG. 6 electrical current increasing from zero (0.0) mA to two and two-hundred and one thousandths (2.201) mA occurs linearly, as contrasted with exponentially; and
2. each successive twelve (12) µA increase on electrical concurrent employs a strategy depicted in FIG. 7 for progressively increasing the electrical current by an averaged amount of current that does not exceed 0.5% of the current flowing through the IDAC 60 except for the first current increase above zero (0.0) mA.

Because electrical current increasing from (0.0) mA to two and two-hundred and one thousandths (2.201) mA is linear, time intervals during which each successive twelve (12) µA electrical current increase occurs are all the same.

FIG. 7 depicts an electrical current $I_N$ initially flowing through the IDAC 60 that is less than two and two-hundred and one thousandths (2.201) mA and therefore is supplied by N series connected switch and current sink pairs. An electrical current increase from $I_N$ to $I_{N+1}$ supplied by N+1 series connected switch and current sink pairs occurs progressively over an interval of time. As illustrated in FIG. 7, the electrical current increases in a sequence of progressively longer electrical current pulses 102 until the additional switch and current sink pair remains fully on. Each of the progressively longer electrical current pulses 102 momentarily increases the total electrical current flowing through the IDAC by twelve (12) µA, i.e. the amount of electrical current preferably supplied by a single switch and current sink pair. Because the electrical current pulses 102 occur at a rate faster than that which human vision can discern, anyone observing a portable device's backlit LCD display whose illumination is energized by such a low electrical current perceives a gradual, smooth increase in display's brightness indicated by the broken line 104 in FIG. 7.

Referring back to FIG. 5, the digital control 62 depicted there is a special purpose digital circuit, operating at a rate specified by the IDAC change rate digital data 74, for controlling the operation of series connected pairs of switches and current sinks included in the analog circuit 64 in accordance with the curve 92 depicted in FIG. 6 during either:
1. an increase in electrical current supplied to backlight LED(s) from an initial current $I_1$ to a subsequent current $I_2$; or
2. a decrease in electrical current supplied to backlight LED(s) from an initial current $I_2$ to a subsequent current $I_1$.

Those skilled in the art of programming digital computers and/or the design of special purpose digital circuits understand that the operation of the IDAC 60 effected by the digital control 62 could alternatively be provided by an appropriately selected and programmed general or special purpose microprocessor, or by a special purpose digital circuit having a configuration that differs from that depicted in FIG. 5.

To generate backlight illumination electrical current having the characteristics depicted in FIG. 6, the digital control 62 included in the IDAC 60 preferably has both:
1. a code and pulse generator 112 that receives the IDAC current digital data 72; and
2. a ramp rate generator 114 that receives the IDAC change rate digital data 74.

The ramp rate generator 114 produces a clock signal 122 for transmission to the code and pulse generator 112 that controls the rate at which the code and pulse generator 112 effects changes in electrical current flowing through the IDAC 60. One way in which the digital control 62 provides software flexibility in selecting different operating modes for the IDAC 60 is having a clock rate that is preferably selected by the IDAC change rate digital data 74 from among ten (10) different alternative rates. The ten (10) different selectable alternative clock rates are generated by a power aware cascaded clock divider 126 included in the ramp rate generator 114. Preferably the fastest rate for the clock signal 122 is 2.0 MHz with a programmable progression of ever slower rates any of which may be selected by the IDAC change rate digital data 74 decreasing to the slowest rate of approximately 2.0 kHz. Each of these progressively slower rates is preferably one-half (½) of the immediately preceding faster rate. In this way the clock divider 126 operates similar to a variable rate clock generator circuit, a type of circuit that is frequently included in present conventional microprocessors.

In addition to the code and pulse generator 112 receiving the clock signal 122, a pair of look up tables ("LUTs") 132 included in the code and pulse generator 112 receive the IDAC current digital data 72. One of the LUTs 132 stores data for controlling operation of the IDAC 60 in the second operating mode, i.e. in the linear portion of the curve 92 depicted in FIG. 6 below the current threshold line 94. The other LUT 132 stores data for controlling operation of the IDAC 60 in the first operating mode, i.e. in the exponential portion of the curve 92 depicted in FIG. 6 between the current threshold line 94 and the maximum current line 96. Entries in the LUTs 132 store data for:
1. every amount of current that the analog circuit 64 can supply to backlighting LED(s), i.e. 2048 entries, and
2. the number of cycles that the code and pulse generator 112 executes when:
   a. increasing from the next lower amount of current to the amount of current specified for that particular entry in the LUT 132; and
   b. decreasing from the amount of current specified for that particular entry in the LUT 132 to the next lower amount of current.

Consequently, the LUTs 132, operating analogously to an instruction decoder in a conventional digital computer, constitute a second way in which the digital control 62 provides software flexibility in specifying transitions in electrical current supplied to a backlight's LED(s) between two (2) different currents, e.g. between the currents $I_1$ and $I_2$ indicated in FIG. 6 on the curve 92.

Data stored in the LUTs 132 selected by IDAC current digital data 72 are transmitted:
1. via a LUT data bus 134 to comparators 136; and
2. also to:
   a. a cycle counter 142; and
   b. a code counter 144.

Responsive to data received from the LUTs 132, the cycle counter 142 counts cycles executed by the code and pulse generator 112 in changing the electrical current supplied by the IDAC 60 to backlighting LED(s) during a transition between immediately adjacent entries in the LUTs 132. In a manner described in greater detail below, while transitioning between immediately adjacent entries in the LUTs 132 the code counter 144 counts events that occur throughout the transition.

The code and pulse generator 112 also includes a code calculator 152 that receives signals from both the cycle counter 142 and code counter 144. Depending upon whether electrical current being supplied by the IDAC 60 is increasing or decreasing, while the IDAC 60 performs a transition between immediately adjacent entries in the LUTs 132 responding to the received signals the code calculator 152 either increases or decreases by one (1) the entry in the LUTs 132 that specifies the next electrical current change to be performed by the IDAC 60. The LUT 132 also transmits signals via a LUT entry bus 154 to the comparators 136 which compares those signals with the data received from the LUTs 132 to determine when the electrical current supplied by the IDAC 60 to backlighting LED(s) reaches that specified by the IDAC current digital data 72.

Lastly, the code calculator 152 transmits via a pulse count bus 156 the number of pulses having the characteristics depicted in FIG. 7 that a pulse generator 162 included in the code and pulse generator 112 must generate and transmit to the analog circuit 64 during each of the cycles required for changing electrical current specified by the current entry in the LUTs 132.

Figure 8:
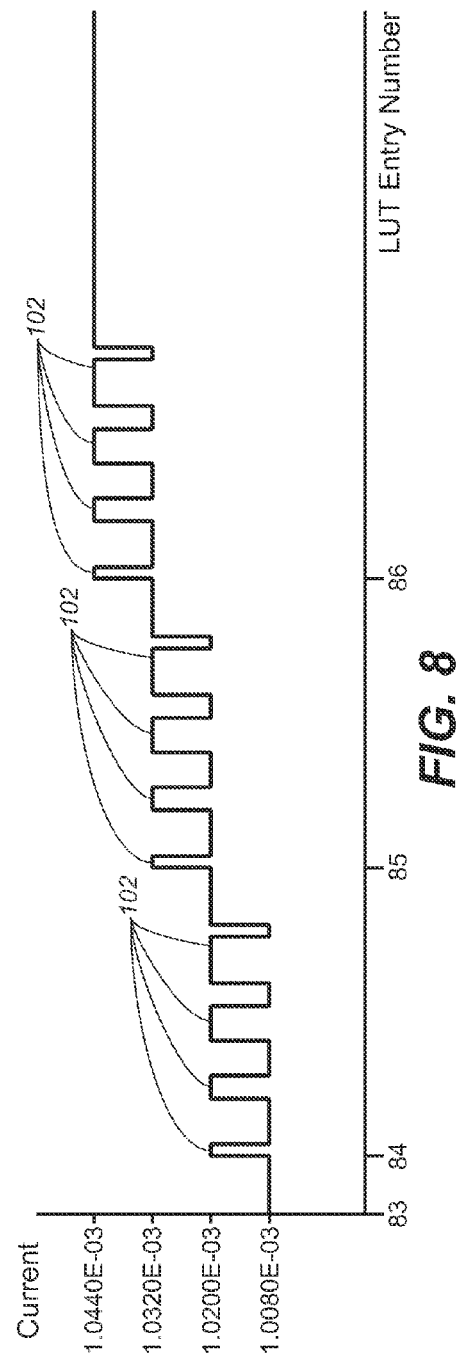
FIG. 8 is a graph depicting an electrical current increase that occurs while the IDAC operates in the second, linear current increase mode through a sequence of current increases that require successively turning on current sources/sinks.

FIG. 8 depicts an exemplary operation of the IDAC 60 during a transition between supplying a current of 1.008 mA to backlighting LED(s) to supplying 1.044 mA thereto. Initially the digital control 62 is in a steady state supplying digital signals to the analog circuit 64 that cause a current of 1.008 mA, i.e. entry 83 in the LUTs 132, to flow through the backlighting LED(s). When change in the IDAC current digital data 72 occurs which specifies increasing the current to 1.044, mA, i.e. entry 86 in the LUTs 132, as described below the IDAC 60 effects that current change at a rate specified by the IDAC change rate digital data 74. In effecting the specified current increase, the code and pulse generator 112 progressively transitions through entries 84 and 85 in the LUTs 132 until reaching entry 86.

As described above, each entry in the LUTs 132 stores date specifying the number of cycles that the code and pulse generator 112 executes when transitioning between immediately adjacent current levels. For each current level change in increasing the current from 1.008 mA to 1.044 mA the entries in the LUTs 132 each respectively specifies that the code and pulse generator 112 execute five (5) cycles. Consequently, As illustrated in FIG. 8 in effecting each transition first from entry 83 to entry 84 in the LUTs 132, then from entry 84 to entry 85, and finally from entry 85 to entry 86, the cycle counter 142 executes five (5) cycles during each of the transitions.

During each electrical current increase between immediately adjacent entries in the LUT 132, to effect the sequence of progressively longer electrical current pulses 102 depicted in FIG. 7 the pulse generator 162 subdivides each of the five (5) cycles as described below.

1. During the first of the five (5) cycles executed by the cycle counter 142 the pulse generator 162 transmits:
    a. a logic "1" for the initial one-fifth (⅕) of the cycle; followed by
    b. a logic "0" for the remaining four-fifths (⅘) of the cycle.
2. During the second of the five (5) cycles executed by the cycle counter 142 the pulse generator 162 transmits:
    a. a logic "1" for the initial two-fifths (⅖) of the cycle; followed by
    b. a logic "0" for the remaining three-fifths (⅗) of the cycle.
3. During the third of the five (5) cycles executed by the cycle counter 142 the pulse generator 162 transmits:
    a. a logic "1" for the initial three-fifths (⅗) of the cycle; followed by
    b. a logic "0" for the remaining two-fifths (⅖) of the cycle.
4. During the fourth of the five (5) cycles executed by the cycle counter 142 the pulse generator 162 transmits:
    a. a logic "1" for the initial four-fifths (⅘) of the cycle; followed by
    b. a logic "0" for the remaining one-fifth (⅕) of the cycle.
5. During the fifth of the five (5) cycles executed by the cycle counter 142 the pulse generator 162 transmits a logic "1" throughout the entire cycle thereby completing the electrical current increase between immediately adjacent entries in the LUT 132.

As will be apparent to those skilled in the art, when decreasing electrical current between immediately adjacent entries in the LUT 132 the preceding operation of the pulse generator 162 must be reversed so the duration of the logic "1" interval becomes progressively shorter rather than progressively longer.

While the IDAC 60 is changing the electrical current supplied to the backlighting LED(s) from one entry in the LUTs 132 to an immediately adjacent entry in the LUTs 132, the code counter 144 counts both:

1. the number of cycles executed by the cycle counter 142; and
2. the number of progressively longer or shorter electrical current pulses 102 produced by the pulse generator 162 during each of the cycles.

Because each of the transitions described in the preceding example requires five (5) cycles of the cycle counter 142, and the pulse generator 162 produces five (5) successively longer pulses during each of those cycles, during each of the transitions between immediately adjacent entries in the LUT 132 depicted in FIG. 8 the code counter 144 repetitively counts during each of the five (5) cycles the five (5) time intervals which the pulse generator 162 uses in generating each progressively longer pulses for a total count in the code counter 144 of five times five (5×5), i.e. twenty-five (25).

As described in the preceding example, the IDAC 60 operates in the second operating mode of the IDAC 60, i.e. in the linear portion of the curve 92 depicted in FIG. 6 below the current threshold line 94. As is readily apparent to those skilled in the art, when the IDAC 60 operates in the first mode, i.e. in the exponential portion of the curve 92 depicted in FIG. 6 between the current threshold line 94 and the maximum current line 96:

1. the pulse generator 162 need not generate a sequence of progressively longer or shorter pulses; and
2. each increase or decrease in electrical current occurs as a single complete step between immediately adjacent entries in the LUTs 132, each of which successive current increases or decreases occurs respectively following a progressively shorter or progressive longer time interval.

Although the present invention has been described in terms of the presently preferred embodiment, it is to be understood that such disclosure is purely illustrative and is not to be interpreted as limiting. Consequently, without departing from the spirit and scope of the disclosure, various alterations, modifications, and/or alternative applications will, no doubt, be suggested to those skilled in the art after having read the preceding disclosure. Specifically, instead of the digital circuits disclosed herein there undoubtedly exist various alternative digital circuits that might be included in the digital control 62 that would also be capable of generating the data received by the analog circuit 64 via the digital data bus 76 and the PWM control digital data bus 78. Accordingly, it is intended that the following claims be interpreted as encompassing all alterations, modifications, or alternative applications as fall within the true spirit and scope of the disclosure including equivalents thereof. In effecting the preceding intent, the following claims shall:

1. not invoke paragraph 6 of 35 U.S.C. §112 as it exists on the date of filing hereof unless the phrase "means for" appears expressly in the claim's text;
2. omit all elements, steps, or functions not expressly appearing therein unless the element, step or function is expressly described as "essential" or "critical;"
3. not be limited by any other aspect of the present disclosure which does not appear explicitly in the claim's text unless the element, step or function is expressly described as "essential" or "critical;" and
4. when including the transition word "comprises" or "comprising" or any variation thereof, encompass a non-exclusive inclusion, such that a claim which encompasses a process, method, article, or apparatus that comprises a list of steps or elements includes not only those steps or elements but may include other steps or elements not expressly or inherently included in the claim's text.

What is claimed is:

1. A method for supplying a specified electrical current to at least one light emitting diode ("LED") included in a display from a current ("I") digital-to-analog converter ("IDAC") (60), the IDAC (60) including a plurality of individual current sources/sinks (26):

a. for connecting in parallel to the LED so that a total amount of electrical current flowing through the LED equals the sum of individual electrical currents respectively flowing through each of the current sources/sinks (26); and
    b. at any instant in time connected current sources/sinks (26) being either:

i. turned on for supplying electrical current to the LED; or
ii. turned off thereby supplying no electrical current to the LED, the method for supplying the specified electrical current comprising the steps of:
a. when the specified electrical current exceeds a pre-established current threshold (94), increasing the electrical current flowing through the LED is effected by successively turning on individual current sources/sinks (26) included in the IDAC (60) that had been previously turned off; and
b. when the specified electrical current is less that the pre-established current threshold (94), increasing the electrical current flowing through the LED is effected by turning on at least one additional current source/sink (26) included in the IDAC (60) that had been previously turned off, the additional current source/sink (26) being alternatively initially turned on and then subsequently turned off so as to thereby generate a sequence of progressively longer electrical current pulses (102) until the additional current source/sink (26) remains fully on.

2. The method of claim 1 wherein each current source/sink (26) when supplying electrical current to the LED supplies substantially the same electrical current as other current sources/sinks (26) supplying electrical current to the LED.

3. The method of claim 1 wherein when the electrical current supplied to the at least one LED increases from the specified electrical current to a subsequently specified electrical current, while the electrical current supplied to the LED increases from the specified electrical current to the subsequently specified electrical current states of the current sources/sinks (26) connected to the LED of either being turned on or off are arranged to provide successive increases in electrical current supplied to the LED each of which increases do not exceed a pre-established current change threshold.

4. The method of claim 3 wherein the pre-established current change threshold does not exceed one-half of one percent (0.5%) of the electrical current supplied to the at least one LED immediately before each of the successive changes in electrical current occurs.

5. The method of claim 1 wherein a sequence of successive increases in electrical current supplied to the LED occur in response to a timing signal having sequential intervals that decrease non-linearly.

6. The method of claim 1 wherein, when electrical current supplied to the LED is less that the pre-established current threshold (94), a sequence of successive electrical current increases occur in response to a timing signal:
a. for which all intervals are the same; and
b. during each successive interval the sequence of progressively longer electrical current pulses (102) occurs.

7. An electrical current ("I") digital-to-analog converter ("IDAC") integrated circuit ("IC") (60) adapted for supplying a specified electrical current to at least one light emitting diode ("LED") included in a display, the IDAC IC (60) comprising:
a. a digital control (62) for:
1. receiving IDAC control digital signals (72, 74) that specify how the IDAC IC (60) is to operate when supplying the specified electrical current to at least one LED; and
2. generating digital signals (76, 78) for effecting such operation by the IDAC IC (60); and b. an analog circuit (64) that includes a plurality of individual current sources/sinks (26):
1. for connecting in parallel to the LED so that a total amount of electrical current flowing through the LED equals the sum of individual electrical currents respectively flowing through each of the current sources/sinks (26); and
2. at any instant in time connected current sources/sinks (26) being either:
i. turned on for supplying electrical current to the LED; or
ii. turned off thereby supplying no electrical current to the LED, the analog circuit (64) responsive to the digital signals (76, 78) received from the digital control (62):
1. when the specified electrical current exceeds a pre-established current threshold (94), increasing the electrical current flowing through the LED is effected by successively turning on individual current sources/sinks (26) included in the IDAC IC (60) that had been previously turned off; and
2. when the specified electrical current is less that the pre-established current threshold (94), increasing the electrical current flowing through the LED is effected by turning on at least one additional current source/sink (26) included in the IDAC IC (60) that had been previously turned off, the additional current source/sink (26) being alternatively initially turned on and then subsequently turned off so as to thereby generate a sequence of progressively longer electrical current pulses (102) until the additional current source/sink (26) remains fully on.

8. The IDAC IC (60) of claim 7 wherein each current source/sink (26) connected to the LED when turned on supplying substantially the same electrical current as other current sources/sinks (26) supplying electrical current to the LED.

9. The IDAC IC (60) of claim 7 wherein when the electrical current supplied to the at least one LED increases from the specified electrical current to a subsequently specified electrical current, while the electrical current supplied to the LED increases from the specified electrical current to the subsequently specified electrical current states of the current sources/sinks (26) connectable to the LED of either being turned on or off are arranged to provide successive increases in electrical current supplied to the LED each of which increases do not exceed a pre-established current change threshold.

10. The IDAC IC (60) of claim 9 wherein the pre-established current change threshold does not exceed one-half of one percent (0.5%) of the electrical current supplied to the at least one LED immediately before each of the successive changes in electrical current occurs.

11. The IDAC IC (60) of claim 7 wherein a sequence of successive increases in electrical current supplied to the LED occur in response to a timing signal having sequential intervals that decrease non-linearly.

12. The IDAC IC (60) of claim 7 wherein, when electrical current supplied to the LED is less that the pre-established current threshold (94), a sequence of successive electrical current increases occur in response to a timing signal:
a. for which all intervals are the same; and
b. during each successive interval the sequence of progressively longer electrical current pulses (102) occurs.

* * * * *